US008054266B2

(12) United States Patent
Woo et al.

(10) Patent No.: US 8,054,266 B2
(45) Date of Patent: Nov. 8, 2011

(54) DISPLAY DEVICE, DRIVING APPARATUS FOR DISPLAY DEVICE, AND DRIVING METHOD OF DISPLAY DEVICE

(75) Inventors: Doo-Hyung Woo, Anyang-si (KR); Il-Gon Kim, Seoul (KR); Kee-Chan Park, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 894 days.

(21) Appl. No.: 11/652,872

(22) Filed: Jan. 11, 2007

(65) Prior Publication Data

US 2007/0268225 A1 Nov. 22, 2007

(30) Foreign Application Priority Data

May 19, 2006 (KR) ........................ 10-2006-0045058

(51) Int. Cl.

| | |
|---|---|
| ***G09G 3/36*** | (2006.01) |
| ***G09G 5/00*** | (2006.01) |
| ***G09G 5/10*** | (2006.01) |
| ***G06F 3/038*** | (2006.01) |
| ***H03K 17/80*** | (2006.01) |
| *H03K 19/082* | (2006.01) |
| *H03K 19/086* | (2006.01) |
| *H03K 19/088* | (2006.01) |

(52) U.S. Cl. ............ 345/89; 345/87; 345/204; 345/211; 345/690; 345/691; 307/407; 307/408; 307/409; 307/410; 307/411; 326/124; 326/125; 326/126; 326/128

(58) Field of Classification Search .................... 345/89, 345/204–699; 307/407–411; 326/124–129

See application file for complete search history.

(56) References Cited

U.S. PATENT DOCUMENTS

| | | | | |
|---|---|---|---|---|
| 5,363,118 | A * | 11/1994 | Okumura | 345/95 |
| 5,877,717 | A * | 3/1999 | Tu et al. | 341/150 |
| 6,232,948 | B1 * | 5/2001 | Tsuchi | 345/99 |
| 6,441,763 | B1 | 8/2002 | Nakao | |
| 6,570,560 | B2 * | 5/2003 | Hashimoto | 345/211 |
| 6,950,045 | B2 | 9/2005 | Kim | |
| 2002/0063666 | A1 * | 5/2002 | Kang et al. | 345/87 |
| 2002/0075249 | A1 * | 6/2002 | Kubota et al. | 345/204 |
| 2005/0057482 | A1 * | 3/2005 | Youngblood et al. | 345/100 |
| 2006/0214900 | A1 * | 9/2006 | Tsuchi et al. | 345/98 |

FOREIGN PATENT DOCUMENTS

CN 1471701 A 1/2004

(Continued)

OTHER PUBLICATIONS

English Language Abstract, KR Patent First Publication No. 1020060014551, Feb. 16, 2006, 1 page.

(Continued)

*Primary Examiner* — Sumati Lefkowitz
*Assistant Examiner* — David Tung
(74) *Attorney, Agent, or Firm* — Innovation Counsel LLP

(57) ABSTRACT

A driving apparatus for a display device includes a gray voltage generator that generates a plurality of gray voltage sets, each including a plurality of gray voltages having different levels, and a signal converter that includes a first selector for selecting one gray voltage set among the plurality of gray voltage sets on the basis of a first portion of an image signal and a second selector for selecting one or more gray voltages among the plurality of gray voltages belonging to the selected gray voltage set on the basis of a second portion of the image signal to output and select gray voltages with a smaller size digital-analog converter.

19 Claims, 8 Drawing Sheets

FOREIGN PATENT DOCUMENTS

| | | | |
|---|---|---|---|
| CN | 1732505 | A | 2/2006 |
| EP | 0996108 | A | 4/2000 |
| JP | 09-138670 | | 5/1997 |
| JP | 09-198012 | | 7/1997 |
| JP | 2000-013226 | | 1/2000 |
| JP | 2001-051661 | | 2/2001 |
| JP | 2002-215108 | | 7/2002 |
| KR | 102000005940 | | 9/2000 |
| KR | 1020050015035 | | 2/2005 |
| KR | 1020050058761 | | 6/2005 |
| KR | 1020050116098 | | 12/2005 |
| KR | 1020060014551 | | 2/2006 |

OTHER PUBLICATIONS

English Language Abstract, KR Patent First Publication No. 1020050116098, Dec. 9, 2005, 1 page.

English Language Abstract, KR Patent First Publication No. 1020050058761, Jun. 17, 2005, 1 page.

English Language Abstract, KR Patent First Publication No. 1020050015035, Feb. 21, 2005, 1 page.

English Language Abstract, JP Patent First Publication No. 2002-215108, Jul. 31, 2002, 1 page.

English Language Abstract, JP Patent First Publication No. 2001-051661, Feb. 23, 2001, 1 page.

English Language Abstract, KR Patent First Publication No. 1020000055940, Sep. 15, 2000, 1 page.

English Language Abstract, JP Patent First Publication No. 2000-013226, Jan. 14, 2000, 1 page.

English Language Abstract, JP Patent First Publication No. 09-198012, Jul. 31, 1997, 1 page.

English Language Abstract, JP Patent First Publication No. 09-138670, May 27, 1997, 1 page.

* cited by examiner

DISPLAY DEVICE, DRIVING APPARATUS FOR DISPLAY DEVICE, AND DRIVING METHOD OF DISPLAY DEVICE

CROSS-REFERENCE TO RELATED APPLICATION

This application claims priority to and the benefit of Korean Patent Application No. 10-2006-0045058 filed in the Korean Intellectual Property Office on May 19, 2006, the contents of which are incorporated herein by reference.

FIELD OF THE INVENTION

The present invention relates to a display device, a driving apparatus for a display device, and a driving method for a display device.

DESCRIPTION OF THE RELATED ART

In recent years, the development of light-weight and thin personal computers and televisions has required light-weight and thin display devices. Flat panel displays include liquid crystal display (LCD), field emission display (FED), organic light emitting diode (OLED) display, plasma display panel (PDP), and so on. Generally, an active flat panel display includes a plurality of pixels arranged in a matrix which displays images by controlling the luminance of the pixels.

The luminance information is provided by the signal controller as a digital image signal, converted into an analog data voltage by the digital-to-analog converter of a data driver, and then supplied to each pixel. A plurality of gray voltages that are generated by a gray voltage generator having a column of resistors are supplied to the digital-to-analog converter. The digital-to-analog converter selects a gray voltage corresponding to the digital image signal among the gray voltages, and outputs the selected gray voltage as a data voltage.

When the number of gray voltages is large, the digital-to-analog converter for selecting one of the gray voltages may become complex. Accordingly, there has been suggested a method that allows the gray voltage generator to generate a limited number of gray voltages in the gray voltage generator, and allows the data driver to select one of the limited number of gray voltages, divide the selected gray voltage, and select one of the divided voltages to output the selected voltage as the data voltage. However, previous efforts have not accurately reflected the gamma characteristics of the display device nor have they provided monotonically progressive gray voltages.

SUMMARY OF THE INVENTION

The present invention simplifies the digital-to-analog converter circuit of the data driver and provides a gray voltage value according to the gamma characteristic of the display device as well as monotonically progressive gray voltages. An exemplary embodiment of the present invention provides a driving apparatus for a display device, including a gray voltage generator that generates a plurality of gray voltage sets, each set including a plurality of gray voltages having different levels; and a signal converter that includes a first selector for selecting one gray voltage set among the plurality of gray voltage sets on the basis of a first portion of an image signal, and a second selector for selecting one or more gray voltages among the plurality of gray voltages belonging to the selected gray voltage set on the basis of a second portion of the image signal.

The gray voltage generator may output the plurality of gray voltages belonging to each of the gray voltage sets at different times.

The gray voltage generator may include a plurality of switching elements that selectively transmit the gray voltages.

The second selector may successively output the selected one or more gray voltages.

The last output gray voltage among the successively output one or more gray voltages may correspond to the image signal.

The driving apparatus for a display device according to the exemplary embodiment of the present invention may further include a time controller that provides the second selector with output time information of the gray voltage. The second selector may select the one or more gray voltages on the basis of the second portion of the image signal and the output time information.

The second selector may include a switch element that selectively transmits the plurality of gray voltages belonging to the selected gray voltage set, and an output controller that generates a selection signal for controlling the switching element on the basis of the output time information and the second portion of the image signal.

The output controller may include a pulse width modulator that performs pulse width modulation on the second portion of the image signal on the basis of the output time information so as to generate the selection signal.

The output controller may include a comparator that compares the second portion of the image signal with the output time information, and a selection signal generator that generates the selection signal on the basis of the comparison result. The selection signal may have a first voltage level and a second voltage level. The selection signal may have the first voltage level from a reference time to a predetermined point of time of a section where the output time information is the same as the second portion of the image signal, and may have the second voltage level in other sections. The switching element may be turned on when the selection signal is in the first voltage level.

The first selector may include a plurality of switching element columns, each having a plurality of switching elements connected in series to one another. Each of the switching element columns may transmit one of the plurality of gray voltage sets according to the first portion of the image signal.

The first portion of the image signal may include a third portion and a fourth portion. The first selector may include a first switching element group that selects two or more of the plurality of gray voltage sets on the basis of the third portion of the image signal, and a second switching element group that selects one of the selected two or more gray voltage sets on the basis of the fourth portion of the image signal.

The first selector may further include a first converter that converts the third portion of the image signal so as to generate a first control signal for controlling the first switching element group, and a second converter that converts the fourth portion of the image signal so as to generate a second control signal for controlling the second switching element group.

The first portion of the image signal may be an upper-bit data, and the second portion thereof may be a lower-bit data.

Another embodiment of the present invention provides a display device including a voltage generator that generates a plurality of gray voltage sets, each including a plurality of gray voltages having different levels; a plurality of gray voltage output units that respectively cyclically and sequentially output a plurality of gray voltages belonging to one of the plurality of gray voltage sets through one output terminal; a first selector that selects and outputs one of outputs of the plurality of gray voltage output units on the basis of an upper-bit data of an image signal; a second selector that outputs the output of the first selector during a time based on a lower-bit data of the image signal; and a display panel that displays an image according to the output of the second selector.

Each of the gray voltage output units may include a plurality of switching elements. Each of the switching elements may be connected between one of a plurality of gray voltages belonging to the supplied gray voltage set and the output terminal of the gray voltage output unit, and may be controlled by the lower-bit data of the image signal.

The display device according to another embodiment of the present invention may further include a time controller that provides the second selector with gray voltage output time information of each of the gray voltage output units.

The second selector may include a pulse width modulator that performs pulse width modulation on the lower-bit data of the image signal on the basis of the output time information so as to generate a selection signal, and an output switching element that is controlled according to the selection signal and is connected to the output of the first selector.

The pulse width modulator may include a comparator that compares the lower-bit data of the image signal with the output time information and outputs an output signal, and a selection signal generator that converts a level of the selection signal according to the output signal of the comparator.

The selection signal generator may include a first transistor that is connected to the output of the comparator and is controlled according to a first control signal, a second transistor that is connected between the first transistor and a reference node and is controlled according to the selection signal, an inversion gate that has an input terminal connected to the reference node and outputs the selection signal, and a third transistor that is connected between a first voltage and the reference node and is controlled according to the selection signal.

The selection signal generator may further include a fourth transistor that is connected between a second voltage and the reference node and is controlled according to a second control signal.

The second transistor and the third transistor may be transistors of different conductivity types.

The first selector may include a plurality of switching element columns, each having a plurality of switching elements connected in series to one another. Each of the switching element columns may be connected between one of the plurality of gray voltage output units and the output of the first selector.

Each of the switching elements may be controlled according to one bit of the upper-bit data of the image signal.

Each of the switching elements may be controlled according to two or more bits of the upper-bit data of the image signal.

The upper-bit data of the image signal may include a plurality of divided data having two or more bits. The first selector may further include a plurality of converters that respectively have the same number of output terminals as the number of cases to be represented by the divided data, and that determine outputs of the output terminals on the basis of one of the plurality of divided data. Each of the switching elements may be controlled according to one output of output terminals of the plurality of converters.

Another embodiment of the present invention provides a driving method of a display device including generating a plurality of gray voltage sets, each including a plurality of gray voltages; sequentially outputting a plurality of gray voltages belonging to each of the plurality of gray voltage sets; selecting one of the plurality of gray voltage sets according to upper-bit data of an image signal; selecting one of a plurality of gray voltages belonging to the selected gray voltage set according to a time defined on the basis of lower-bit data of the image signal; and driving pixels according to the selected gray voltage.

BRIEF DESCRIPTION OF THE DRAWINGS

The foregoing and other objects and features of the present invention may become more apparent from a reading of the ensuing description together with the drawing, in which.

DETAILED DESCRIPTION

Figure 1:
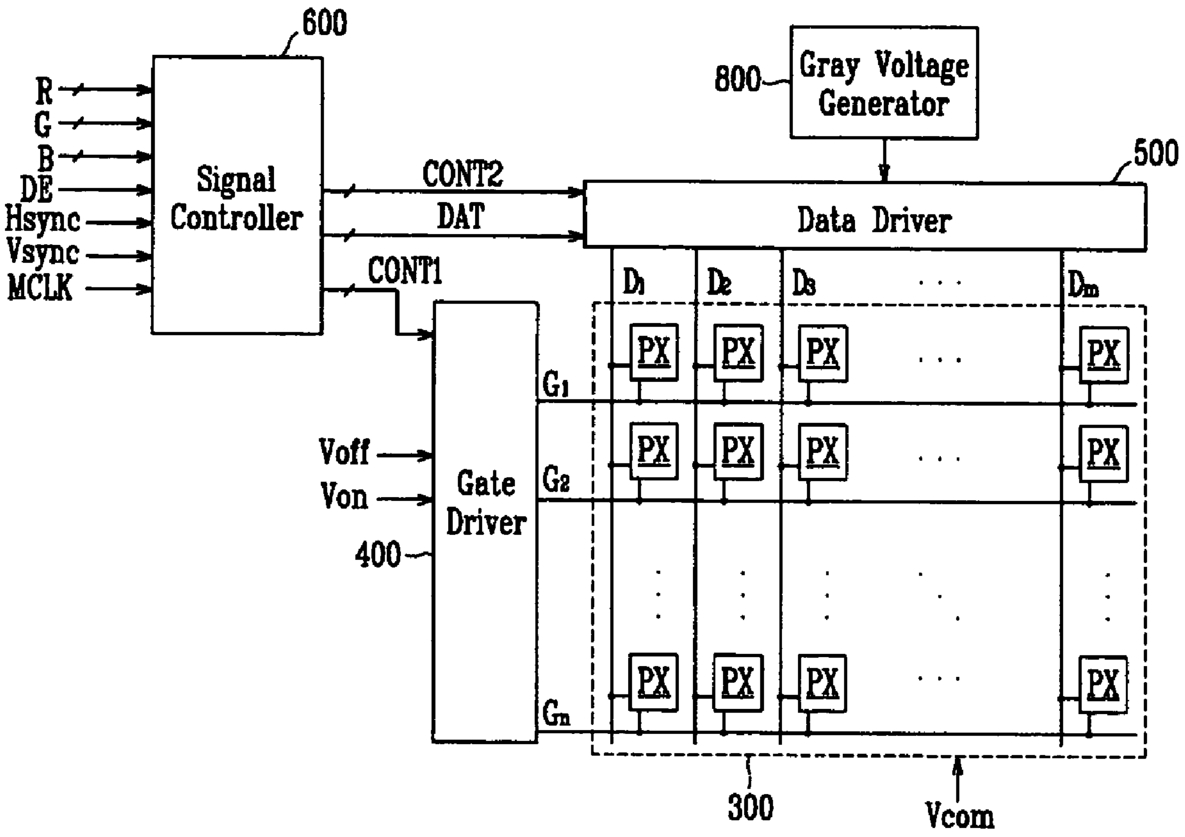
FIG. 1 is a block diagram of a liquid crystal display according to an exemplary embodiment of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
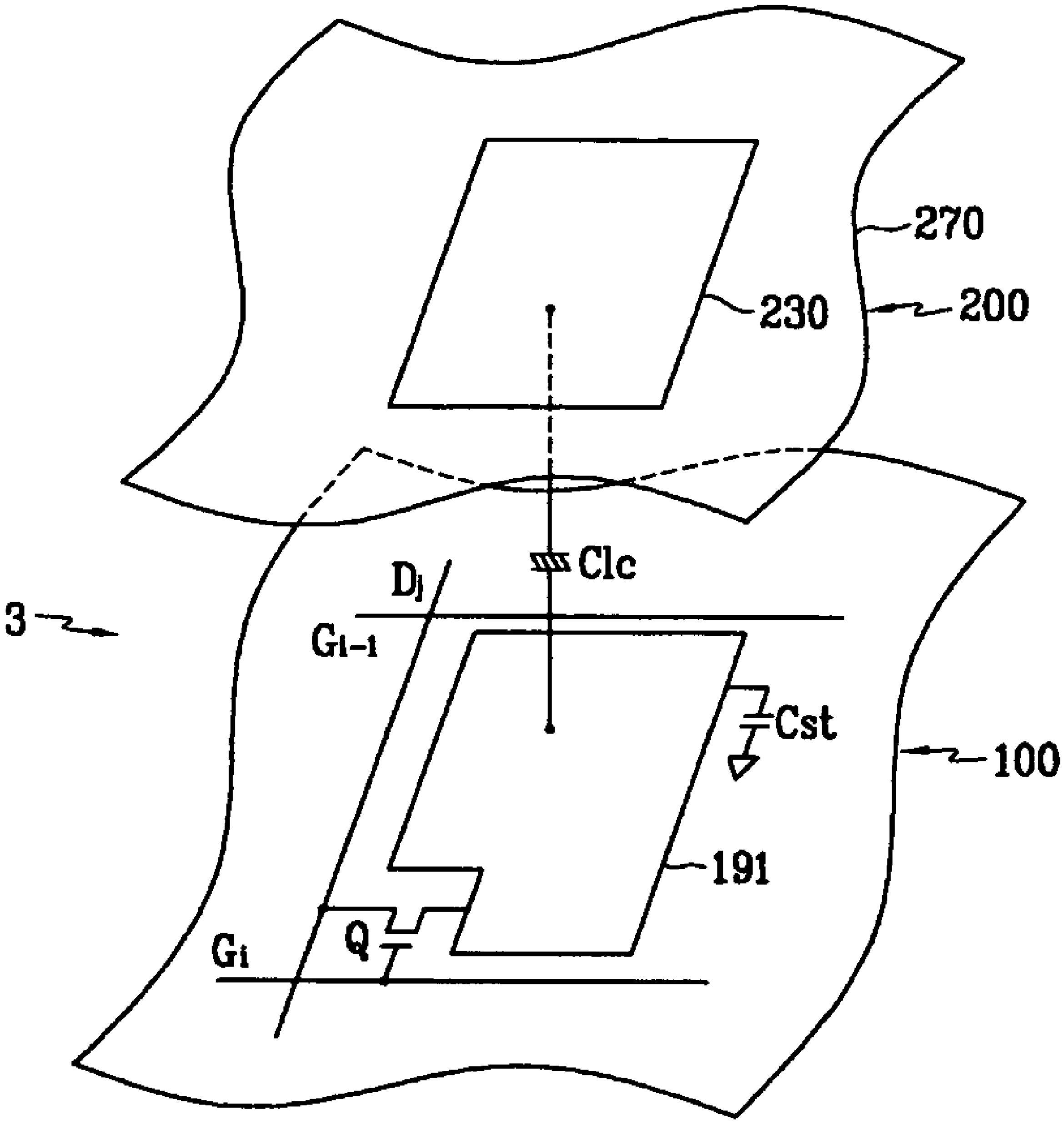
FIG. 2 is an equivalent circuit diagram of one pixel in the liquid crystal display according to the exemplary embodiment of the present invention.

A liquid crystal display that is an example of a display device will now be described in detail with reference to FIGS. 1 and 2. FIG. 1 is a block diagram of a liquid crystal display according to an exemplary embodiment of the present invention, and FIG. 2 is an equivalent circuit diagram of one pixel in the liquid crystal display according to the exemplary embodiment of the present invention.

As shown in FIG. 1, the liquid crystal display according to the exemplary embodiment of the present invention includes a liquid crystal panel assembly 300, a gate driver 400 and a data driver 500 that are connected to the liquid crystal panel assembly 300, a gray voltage generator 800 that is connected to data driver 500, and a signal controller 600 that controls them.

As viewed from the equivalent circuit, the liquid crystal panel assembly 300 includes a plurality of signal lines $G_1$ to $G_n$ and $D_1$ to $D_m$ and a plurality of pixels PX that are correspondingly connected to the plurality of signal lines $G_1$ to $G_n$ and $D_1$ to $D_m$ and are substantially arranged in a matrix shape. Meanwhile, as viewed from the structure shown in FIG. 2, the liquid crystal panel assembly 300 includes lower and upper display panels 100 and 200 that face each other, and a liquid crystal layer 3 that is interposed between the lower and upper display panels 100 and 200.

The signal lines $G_1$ to $G_n$ and $D_1$ to $D_m$ include a plurality of gate lines $G_1$ to $G_n$ that transmit gate signals (also referred to as "scanning signals") and a plurality of data lines $D_1$ to $D_m$ that transmit data voltages. The gate lines $G_1$ to $G_n$ substantially extend in a row direction and are in parallel with one another, and the data lines $D_1$ to $D_m$ substantially extend in a column direction and are in parallel with one another.

Each pixel PX, for example a pixel PX that is connected to the i-th (where i=1, 2, . . . , and n) gate line $G_i$ and the j-th (where j=1, 2, . . . , and m) data line $D_j$ includes a switching element Q that is connected to the signal lines $G_i$ and $D_j$, and a liquid crystal capacitor Clc and a storage capacitor Cst that are connected to the switching element Q. The storage capacitor Cst can be omitted, if necessary.

The switching element Q is a three-terminal element, such as a thin film transistor, and is provided in the lower panel 100. A control terminal of the switching element Q is connected to the gate line $G_i$, an input terminal thereof is connected to the data line $D_j$, and an output terminal thereof is connected to the liquid crystal capacitor Clc and the storage capacitor Cst. The thin film transistor may include polysilicon or amorphous silicon.

The liquid crystal capacitor Clc has two terminals of a pixel electrode 191 of the lower panel 100 and a common electrode 270 of the upper panel 200. A liquid crystal layer 3 that is interposed between the two electrodes 191 and 270 serves as a dielectric. The pixel electrode 191 is connected to the switching element Q, and the common electrode 270 is formed on the entire surface of the upper panel 200. A common voltage Vcom is applied to the common electrode 270. Unlike FIG. 2, the common electrode 270 may be provided on the lower panel 100. In this case, at least one of the two electrodes 191 and 270 may be formed in a linear or bar shape.

The storage capacitor Cst that assists the liquid crystal capacitor Clc is formed by overlapping a separate signal line (not shown) and the pixel electrode 191 provided in the lower panel 100 with an insulator interposed therebetween. A predetermined voltage, such as the common voltage Vcom, is applied to the separate signal line. Alternatively, the storage capacitor Cst may be formed by overlapping the pixel electrode 191 and the previous gate line through the insulator.

In order to implement color display, each pixel PX uniquely displays one of primary colors (spatial division), or each pixel PX temporally alternately display primary colors (temporal division). Then, the primary colors are spatially and temporally synthesized, and thus a desired color is recognized. Examples of the primary colors include three primary colors of red, green, and blue. FIG. 2 shows an example of the spatial division. In FIG. 2, each pixel PX has a color filter 230 that represents one of the primary colors in a region of the upper panel 200 corresponding to the pixel electrode 191. Unlike FIG. 2, the color filter 230 may be disposed above or below the pixel electrode 191 of the lower panel 100. At least one polarizer (not shown) that polarizes light is attached to an outer surface of the liquid crystal panel assembly 300.

Returning to FIG. 1, gray voltage generator 800 generates two sets of gray voltages related to transmittance of the pixel PX. One of the two sets of gray voltages has a positive value with respect to the common voltage Vcom, and the other set has a negative value with respect to the common voltage Vcom. The number of gray voltages in one set of gray voltages generated by gray voltage generator 800 may be the same as the number of gray levels that can be displayed by the liquid crystal display.

Gate driver 400 is connected to the gate lines $G_1$ to $G_n$ of the liquid crystal panel assembly 300, and applies the gate signals obtained by combining a gate-on voltage Von and a gate-off voltage Voff to the gate lines $G_1$ to $G_n$.

Data driver 500 is connected to the data lines $D_1$ to $D_m$ of the liquid crystal panel assembly 300, selects the gray voltages from gray voltage generator 800, and applies the selected gray voltages to the data line $D_1$ to $D_m$ as the data voltages. The detailed structure of data driver 500 will be described below. Signal controller 600 controls gate driver 400, data driver 500, and so on.

Each of the driving devices 400, 500, 600, and 800 may be incorporated into the liquid crystal panel assembly 300, together with the signal lines $G_1$ to $G_n$ and $D_1$ to $D_m$, the thin film transistor switching elements Q, and so on. Alternatively, the driving devices 400, 500, 600, and 800 may be directly mounted on the liquid crystal panel assembly 300 as at least one IC chip, or may be mounted on a flexible printed circuit film (not shown) and attached to the liquid crystal panel assembly 300 as a TCP (tape carrier package). Further, each driving device may be mounted on a separate printed circuit board (PCB) (not shown). In addition, the driving devices 400, 500, 600, and 800 may be integrated into a single chip. In this case, at least one of the driving devices 400, 500, 600, and 800 or at least one circuit element of the driving devices 400, 500, 600, and 800 may be provided outside the single chip.

The operation of the liquid crystal display will now be described in detail.

Signal controller 600 receives input image signal R, G, and B and input control signals for controlling display thereof from an external graphics controller (not shown). The input image signal R, G, and B have luminance information of each pixel PX, and the luminance has a predetermined number of gray levels, for example 1024 (=$2^{10}$), 256 (=$2^8$), or 64 (=$2^6$). Examples of the input control signals include a vertical synchronizing signal Vsync, a horizontal synchronizing signal Hsync, a main clock signal MCLK, and a data enable signal DE.

Signal controller 600 appropriately processes the input image signals R, G, and B on the basis of the input control signals according to the operating conditions of the liquid crystal panel assembly 300, and generates a gate control signal CONT1 and a data control signal CONT2. Then, signal controller 600 transmits the gate control signal CONT1 to gate driver 400, and transmits the data control signal CONT2 and the processed image signal DAT to data driver 500.

Gate control signal CONT1 includes a scanning start signal STV for instructing to start scanning, and at least one clock signal for controlling an output cycle of the gate-on voltage Von. Gate control signal CONT1 may further include an output enable signal OE for defining the duration of the gate-on voltage Von.

Data control signal CONT2 includes a horizontal synchronization start signal STH for informing the start of transmission of the digital image signals DAT to one row of pixels PX, a load signal LOAD for instructing to apply analog data voltages to the data lines $D_1$ to $D_m$, and a data clock signal HCLK. Data control signal CONT2 may further include an inversion signal RVS for inverting the voltage polarity of the analog data voltage with respect to the common voltage Vcom (hereinafter, "the polarity of the data voltage with respect to the common voltage" is simply referred to as "the polarity of the data voltage").

Data driver 500 receives the digital image signals DAT for a row of pixels PX according to data control signal CONT2 from signal controller 600, and selects the gray voltages corresponding to the digital image signals DAT. Then, data driver

500 converts the digital image signals DAT into the analog data voltages, and applies the converted analog data voltages to the data lines $D_1$ to $D_m$.

Gate driver 400 applies the gate-on voltage Von to the gate lines $G_1$ to $G_n$ according to the gate control signal CONT1 from signal controller 600, and turns on the switching elements Q that are respectively connected to the gate lines $G_1$ to $G_n$. Then, the data voltages applied to the data lines $D_1$ to $D_m$ are applied to the pixels PX through the turned-on switching elements Q.

The difference between the data voltage applied to the pixel PX and the common voltage Vcom becomes the charging voltage of the liquid crystal capacitor $C_{LC}$, that is, a pixel voltage. The arrangement of liquid crystal molecules varies according to the magnitude of the pixel voltage, such that the polarization of light passing through the liquid crystal layer 3 changes. The change of the polarization causes a change in transmittance of light by the polarizer that is attached to the display panel assembly 300. Then, the pixel PX displays luminance represented by the gray level of the image signal DAT.

This process is repeated for every one horizontal period, which is also called "1H" and is equal to one cycle of the horizontal synchronizing signal Hsync and the data enable signal DE. Then, the gate-on voltage Von is sequentially applied to all the gate lines $G_1$ to $G_n$, and the data voltages are applied to all the pixels PX, such that the images for one frame are displayed.

When the next frame starts after one frame is completed, the state of the inversion signal RVS applied to data driver 500 is controlled such that the polarity of the data voltage applied to each pixel PX is inverted with respect to the polarity of the previous frame ("frame inversion"). At this time, in one frame the polarity of the data voltage that flows in a data line may be inverted (for example, row inversion and dot inversion) or the polarities of the data voltages that are applied to a row of pixels may vary (for example, column inversion and dot inversion), according to the characteristic of the inversion signal RVS.

Data driver 500 and gray voltage generator 800 according to the exemplary embodiment of the present invention will now be described in detail with reference to FIGS. 3 to 8.

Figure 3:
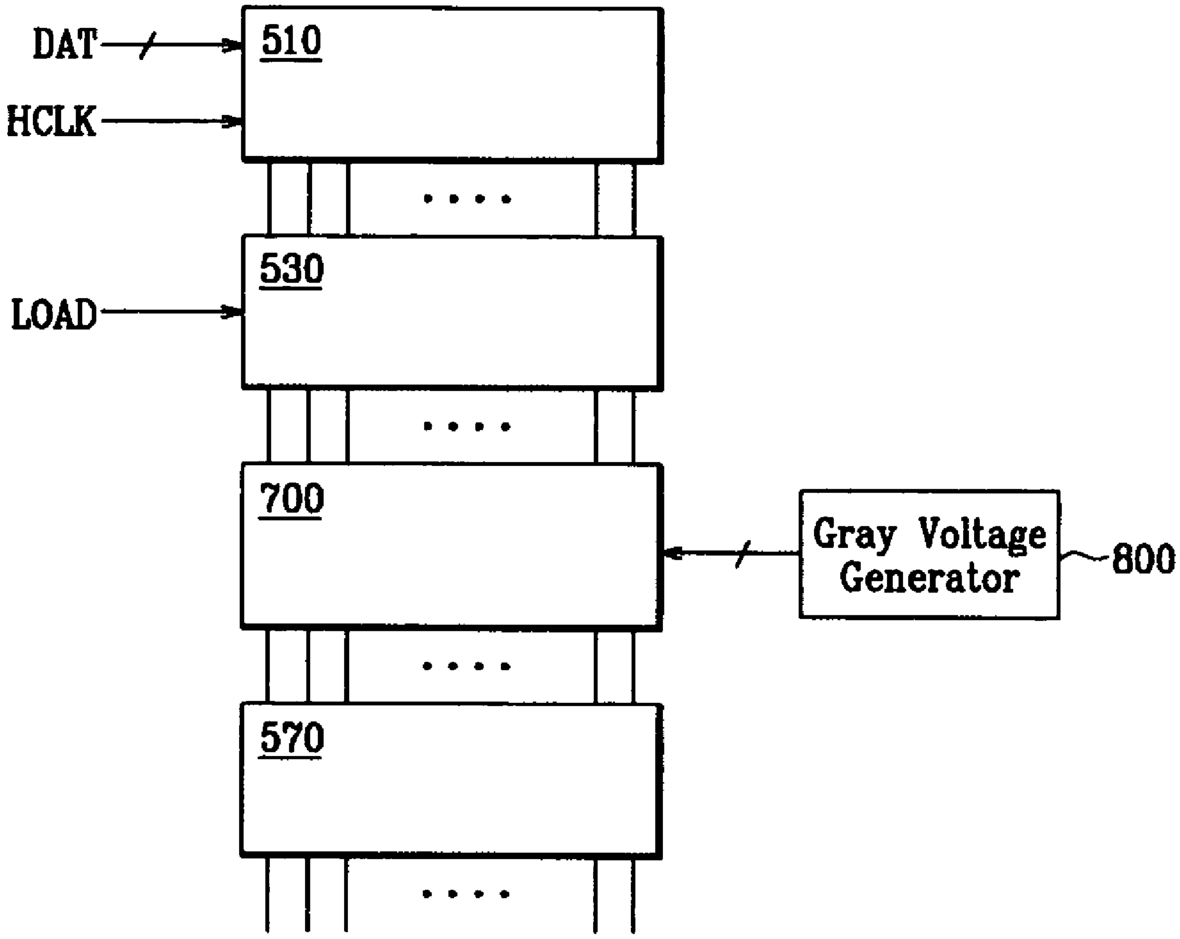
FIG. 3 is a block diagram of a data driver and a gray voltage generator in the liquid crystal display according to the exemplary embodiment of the present invention.
Figure 4:
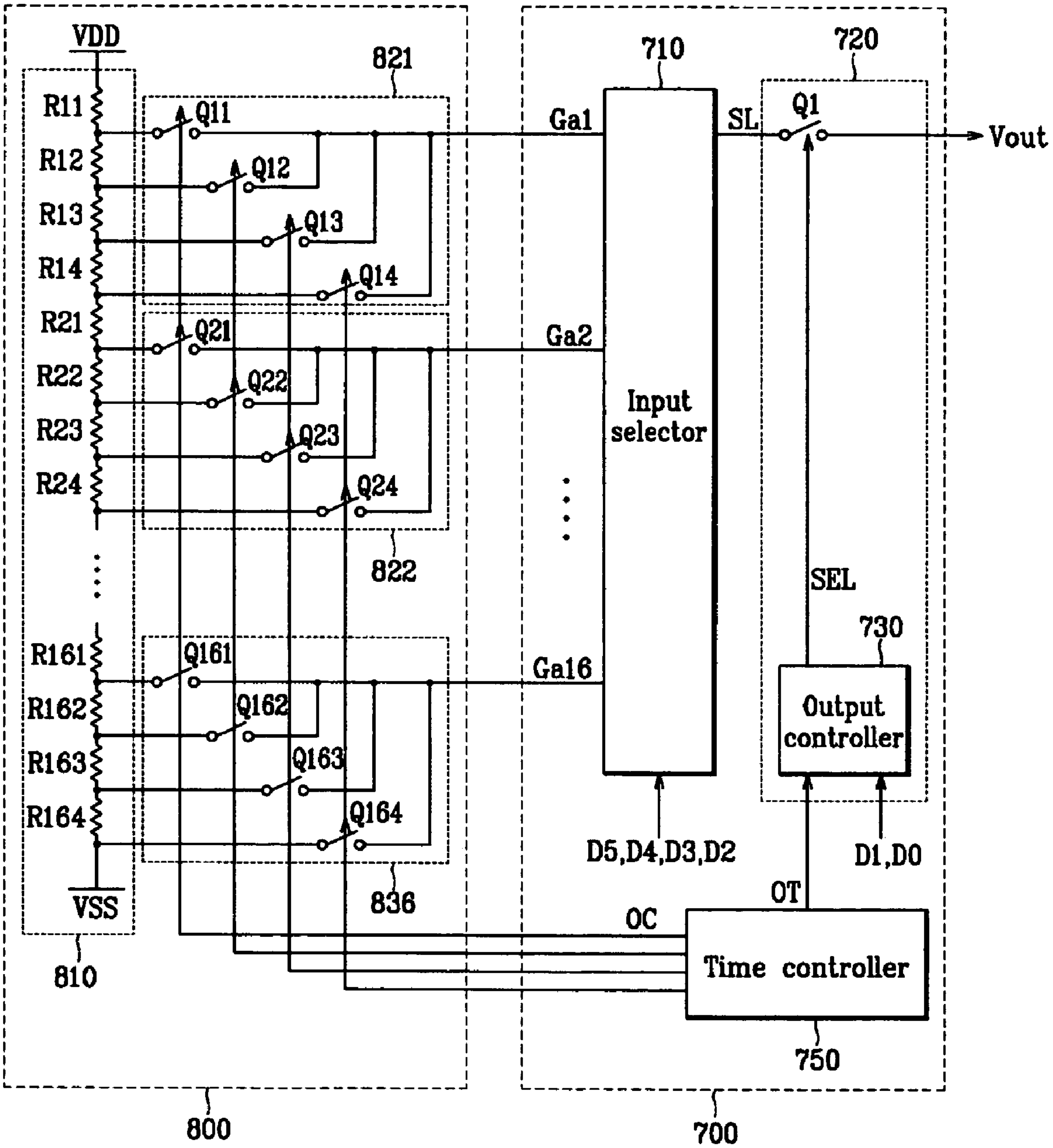
FIG. 4 is a detailed view of a digital-analog converter and a gray voltage generator of the data driver shown in FIG. 3.

FIG. 3 is a block diagram of a data driver in the liquid crystal display according to the exemplary embodiment of the present invention, and FIG. 4 is a detailed view of a digital-analog converter and a gray voltage generator of the data driver shown in FIG. 3.

Referring to FIG. 3, data driver 500 includes a shift register 510, a latch 530, a digital-analog converter 700, and an output buffer 570 that are sequentially connected to each other.

When receiving the horizontal synchronization start signal STH (or a shift clock signal), the shift register 510 transmits the image signal DAT to the latch 530 according to the data clock signal HCLK.

The latch 530 stores the image signal DAT, and sends the stored image signal DAT to the digital-analog converter 700 according to the load signal LOAD.

The digital-analog converter 700 receives the gray voltage from gray voltage generator 800, converts the digital image signal DAT into the analog data voltage, and sends the converted analog data voltage to the output buffer 570.

The output buffer 570 outputs the voltage from the digital-analog converter 700 to the data line as the data voltage, and holds the output data voltage during one horizontal period.

Referring to FIG. 4, gray voltage generator 800 according to the exemplary embodiment of the present invention includes a column of resistors 810 and a plurality of output units 821 to 836.

The resistors 810 include a plurality of resistors R11 to R164 that are connected in series between a first reference voltage VDD and a second reference voltage VSS. A voltage at a node between resistors R11 to R164 becomes a gray voltage. In FIG. 4, when it is assumed that the number of gray levels to be displayed by a pixel is 64, the total number of resistors is 64.

The resistors R11 to R164 may have the same resistance. In this case, the voltage difference between the first reference voltage VDD and the second reference voltage VSS is equally divided. Alternatively, the resistors R11 to R164 may have different resistances and, advantageously, the resistance values can be determined to fit the gamma curve of the display device.

The output units 821 to 836 are respectively connected to nodes between resistors R11 to R164, and they include a plurality of adjacent selection switching elements Q11 to Q14, . . . , Q161 to Q164. The switching elements Q11 to Q14, . . . , and Q161 to Q164) in the individual output units 821 to 836 are turned on at different times from one another, and output the gray voltages. The output terminals of the switching elements of each output unit are connected to one another. Accordingly, the number of output units 821 to 836, that is, the number of outputs Ga1 to Ga16 of gray voltage generator 800, is smaller than the number of resistors of the column of resistors 810.

For example, when the image signal DAT serving as a digital signal is divided into lower-bit data and upper-bit data, the number of gray voltages generated by gray voltage generator 800 is the same as the number of gray levels to be represented by the image signal DAT. The number of output units 821 to 836 is the same as the number of cases to be represented by the upper-bit data. In addition, the number of gray voltages output by each of the output units 821 to 836 is the same as the number of cases to be represented by the lower-bit data. As shown in the drawing, when the number of bits of the image signal DAT is 6, the number of upper bits is 4 and the number of lower bits is 2, the total number of gray voltages generated by gray voltage generator 800 is 64, the number of the output units 821 to 836 is 16, and the number of gray voltages output by each of the output units 821 to 836 is 4.

Referring to FIG. 4, the digital-analog converter 700 includes an input selector 710, an output selector 720, and a time controller 750.

The input selector 710 is connected to the output units 821 to 836 of gray voltage generator 800, and receives the outputs Ga1 to Ga16 of gray voltage generator 800 as inputs. The input selector 710 further receives the upper-bit data D5, D4, D3, and D2 of the image signal DAT, and selects and outputs one of the plurality of inputs Ga1 to Ga16 on the basis of the upper-bit data D5, D4, D3, and D2.

Figure 5:
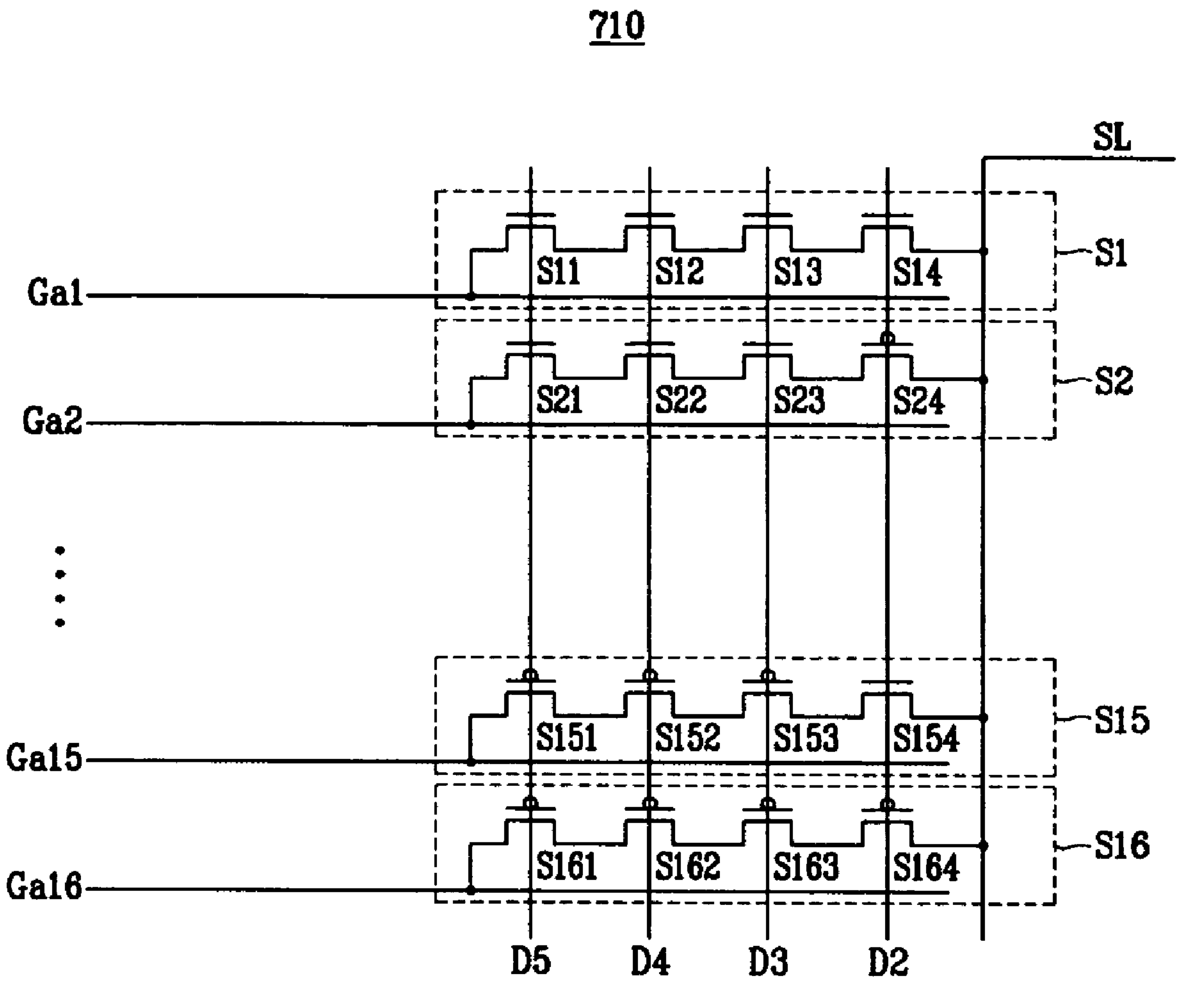
FIG. 5 is a circuit diagram showing an example of an input selector shown in FIG. 4.
Figure 6:
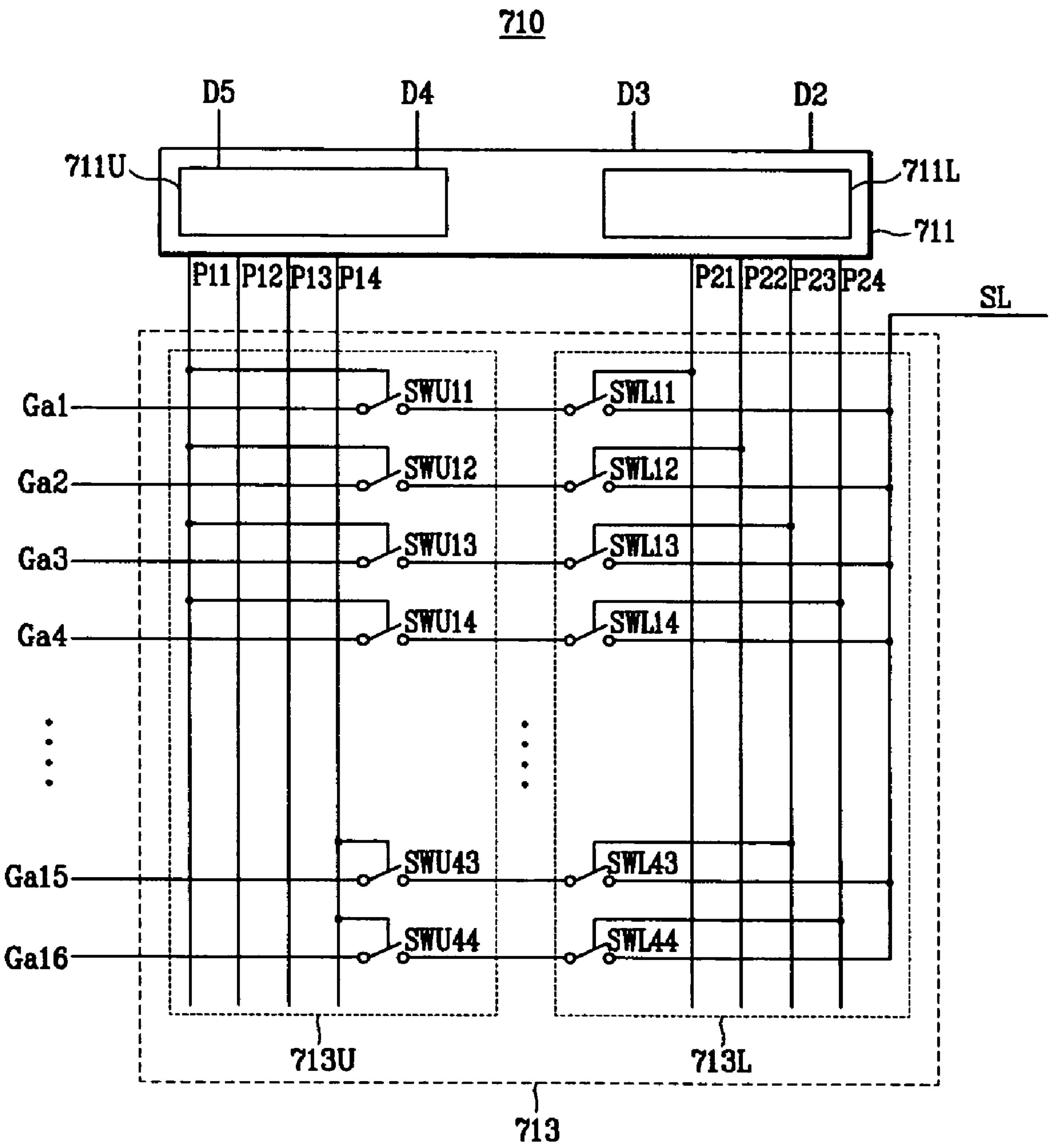
FIG. 6 is a circuit diagram showing another example of the input selector shown in FIG. 4.

FIG. 5 is a circuit diagram showing an example of the input selector shown in FIG. 4, and FIG. 6 is a circuit diagram showing another example of the input selector shown in FIG. 4.

Referring to FIG. 5, the input selector 710 according to the exemplary embodiment of the present invention includes a plurality of switching transistor columns S1 to S16.

An input terminal of each of the switching transistor columns S1 to S16 is connected to one of the inputs Ga1, Ga2, . . . , and Ga16 of the input selector 710. Output terminals of the switching transistor columns S1 to S16 are connected to one another so as to form an output SL of the input selector 710.

The switching transistor columns S1 to S16 respectively include a plurality of switching transistors S11 to S14, . . . , and S161 to S164 that are connected in series. Here, the series connection means that the input terminals of the switching transistors are connected to the output terminals of other switching transistors one another.

The number of switching transistors S11 to S14, . . . , and S161 to S164 respectively belonging to the switching transistor columns S1 to S16 are the same. For example, the number of switching transistors is the same as the number of bits of the upper-bit data of the image signal DAT. The switching transistors S11 to S14, . . . , and S161 to S164 of the switching transistor columns S1 to S16 may be N-type or P-type transistors. The switching transistor columns S1 to S16 include all possible combinations.

The switching transistors S11, . . . , S161, S12, . . . , S162, S163, . . . , S163, and S14, . . . S164 of the switching transistor columns S1 to S16, that is, the switching transistors S11, . . . , S161, S12, . . . , S162, S13, . . . , S163, and S14, . . . , S164 arranged in the column direction of the drawing, are connected in parallel to one another. Here, the parallel connection means that the control terminals of the switching elements are connected to one another. For example, the control terminals of the first switching transistors S111, S21, . . . , and S161 in all the switching transistor columns S1 to S16 are connected to one another, and the control terminals of the second switching transistors S12, S22, . . . , S162 are connected to one another. The upper-bit data D5, D4, D3, and D2 of the image signal DAT are respectively input to the control terminals the switching transistor S11, . . . , S161, S12, . . . , S162, S13, . . . , S163, and S14, . . . , S164 that are respectively connected in parallel to one another.

The switching transistor columns S1 to S16 respectively output the inputs Ga1, Ga2, . . . , Ga16 as the output SL when all the switching transistors S11 to S164 are simultaneously turned on according to the upper-bit data D5, D4, D3, and D2 of the image signal DAT.

Referring to FIG. 6, an input selector 710 according to another exemplary embodiment of the present invention includes an upper data converter 711 and a switching unit 713.

The upper data converter 711 receives the upper-bit data D5, D4, D3, and D2 of the image signal DAT, and includes a plurality of divided data converters 711U and 711L. Each of the upper-bit data D5, D4, D3, and D2 is divided into a plurality of divided data having two or more bits, and the divided data is input to the upper data converter 711 (in the drawing, the divided data is input in parallel through different signal lines by bits, but the invention is not limited to this configuration). One divided data is input to each of the divided data converters 711U and 711L. Each of the divided data converters 711U and 711L selects one of a plurality of output terminals P11 to P14 or P21 to P24 on the basis of the divided data, and supplies a high voltage thereto.

Each of the upper-bit data D5, D4, D3, and D2 may be, for example, divided into a plurality of divided data having two bits, or may be divided into two divided data. The number of output terminals P11 to P14 or P21 to P24 of each of the divided data converters 711U and 711L is the same as the number of cases represented by the divided data. For example, when the number of bits of the divided data is two, the number of cases represented by each divided data is four, the number of output terminal P11 to P14 or P21 to P24 of each of the divided data converters 711U and 711L is 4, and the number of the divided data converter 711U and 711L is BN (=the number of bits of the upper-bit data)×½. Accordingly, the total number of output terminals P11 to P14 and P21 to P24 of the data converter 711 becomes 4×BN×½=2BN. When each of the upper-bit data D5, D4, D3, and D2 is divided into two divided data, the number of bits of the divided data is BN/2, and the number of cases represented by the divided data is $2^{BN/2}$. Accordingly, the number of output terminals P11 to P14 or P21 to P24 of each of the divided data converters 711U and 711L is $2^{BN/2}$, and the total number of output terminals P11 to P14 and P21 to P24 of the upper data converter 711 becomes 2 N/2+1.

The switching unit 713 is connected to the upper data converter 711. The switching unit 713 receives a plurality of inputs Ga1 to Ga16 from gray voltage generator 800, selects one of them, and outputs the selected one as the output SL.

The switching unit 713 includes a plurality of switching element groups 713U and 713L. The number of switching element groups 713U and 713L is the same as the number of divided data converters 711U and 711L. The switching element groups 713U and 713L are respectively connected to the divided data converters 711U and 711L.

One switching group 713U of the switching element groups 713U and 713L is connected to the inputs Ga1 to Ga16, and the other switching group 713L is connected to the output SL. In addition, the switching element groups 713U and 713L are connected to each other.

The switching element group 713U or 713L includes a plurality of switching elements SWU11 to SWU14, . . . , and SWU41 to SWU44 or SWL11 to SWL14, . . . , and SWL41 to SWL44. The number of switching elements SWU11 to SWU44 or SWL11 to SWL44 of the switching element group 713U or 713L is the same as the number of inputs Ga1 to Ga16. Each of the switching elements SWU11 to SWU44 or SWL11 to SWL44 is connected to one of the outputs of the divided data converter 711U or 711L, and is shut off according to the output of the divided data converter 711U or 711L. The plurality of switching elements SWU11 to SWU44 or SWL11 to SWL44 of the switching element group 713U or 713L are respectively connected to the outputs of the divided data converter 711U or 711L. Accordingly, when the high voltage is output from one of the output terminals of the divided data converter 711U or 711L, the plurality of switching elements SWU1 to SWU44 or SWL11 to SWL44 are turned on, and then the inputs Ga1 to Ga16 are transmitted.

One of the input and output terminals of each of the switching elements SWU11 to SWU44 or SWL11 to SWL44 of the switching element group 713U or 713L is connected to the switching elements SWL11 to SWL44 or SWU11 to SWU44 of an adjacent switching element group 713U or 713L, and the other is connected to one of the inputs Ga1 to Ga16 or the output SL. When the number of switching element groups is three or more, the switching elements in an intermediate switching element group are connected to the switching elements of the switching element groups on both sides, not the input or output terminals.

Further, the switching elements SWL11 to SWL44 of the switching element group 713L that are connected to the switching elements SWU11 to SWU44 of the switching element group 713U connected to the same output of the divided data converter 711U are connected to different outputs of the divided data converter 711L.

With this connection, the switching element group 713U selects several inputs of the plurality of inputs Ga1 to Ga16 according to the output of the divided data converter 711U, and the switching element group 713L selects and outputs one of the selected several inputs of the inputs Ga1 to Ga16 according to the output of the divided data converter 711L.

With this configuration, one of the plurality of inputs Ga1 to Ga16 can be selected according to the upper-bit data D5, D4, D3, and D2 of the image signal DAT.

In addition, the input selector 710 of FIG. 4 can be implemented through various exemplary embodiments.

Returning to FIG. 4, the time controller 750 of the digital-analog converter 700 generates an output control signal OC for controlling output time of various gray voltages output from the individual output units 821 to 836 of gray voltage generator 800 according to the control signal, and outputs information regarding that (hereinafter, referred to as "output time information (OT)") to the output selector 720. The time controller 750 may include a counter.

At this time, the output control signal OC is output through four transmission lines. A voltage for alternately turning on the selection switching elements Q11 to Q14, . . . , and Q161 to Q164) is supplied to the four transmission lines, thereby controlling the output time of the gray voltages. The output time information OT is, for example, a digital signal, and has the same number of bits as the lower-bit data D1 and D0 of the image signal DAT. The value of the output time information OT temporally varies. The output time information represents the relative positions of the switching elements Q11 to Q14, . . . , and Q161 to Q164 output at that time in the output units 821 to 836 or the relative position of the gray voltage.

The output selector 720 is connected to the input selector 710 and the time controller 750, and includes an output controller 730 and an output switching element Q1.

The output controller 730 outputs a selection signal SEL on the basis of the output time information OT of the time controller 750 and the lower-bit data D1 and D0 of the image signal DAT. Examples of the output controller 730 include a pulse width modulator that performs pulse width modulation on the lower-bit data D1 and D0 on the basis of the output time information OT.

The output switching element Q1 is turned on or off according to the selection signal SEL of the output controller 730, selects the value of the output SL of the input selector 710, that is, one or more gray voltages among a plurality of gray voltages output at different times in one of the output units 821 to 836 of gray voltage generator 800, and successively outputs the selected one or more gray voltages. The output of the output switching element Q1 becomes the output of the digital-analog converter 700.

The output controller shown in FIG. 4 will now be described in detail with reference to FIG. 7.

Figure 7:
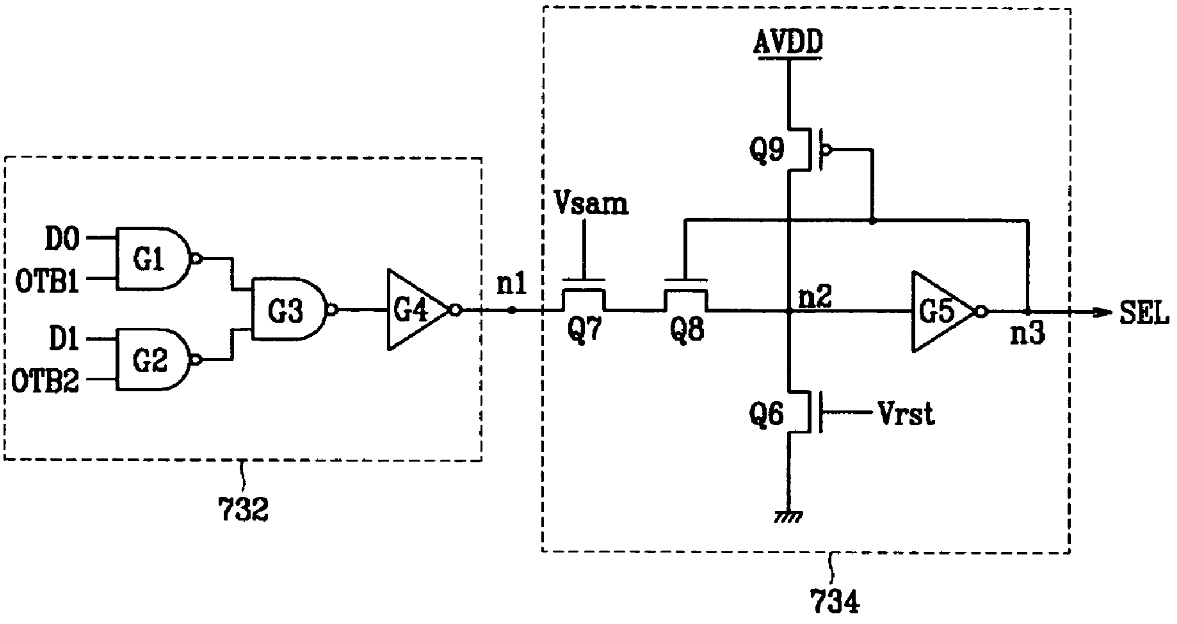
FIG. 7 is a circuit diagram showing an example of an output controller shown in FIG. 4.

FIG. 7 is a circuit diagram showing an example of the output controller shown in FIG. 4.

Referring to FIG. 7, the output controller 730 according to the exemplary embodiment of the present invention is a kind of a pulse width modulator, and includes a comparator 732 and a selection signal generator 734 that are connected to each other at the first node n1.

The comparator 732 compares the output time information OT of the time controller 750 and the lower-bit data D1 and D0 of the image signal DAT, and outputs an output signal. For example, the comparator 732 outputs a high voltage when the output time information OT and the lower-bit data D1 and D0 are the same, and outputs a low voltage when they are different from each other.

The comparator 732 can be implemented in various manners according to the number of bits of the lower-bit data D1 and D0 (=the number of bits of the output time information). For example, like in FIG. 7, when the number of bits of the lower-bit data D1 and D0 is two, the comparator 732 can include three NAND gates G1, G2, and G3 and one inversion gate G4.

That is, the first and second NAND gates G1 and G2 perform a NAND operation of the individual digits of the lower-bit data D1 and D0 of the image signal DAT and the individual digits of inversion data OTB1 and OTB 2 of the output time information OT. The third NAND gate G3 performs a NAND operation on the outputs of the first and second NAND gates G1 and G2. The inversion gate G4 inverts the output of the third NAND gate G3 and outputs the inverted output to the first node n1.

The selection signal generator 734 includes first and second input transistors Q7 and Q8, an initialization transistor Q6, a high voltage transmission transistor Q9, and an inversion gate G5.

The first and second input transistors Q7 and Q8 are connected in series to each other between the first node n1, that is, an input terminal and a second node n2. The inversion gate G5 is connected between the second node n2 and an output terminal n3. The inversion gate G5 inverts the voltage of the second node n2, and outputs the inverted voltage to the output terminal n3 of the selection signal generator 734 as the selection signal SEL.

A control terminal of the first input transistor Q7 receives a sampling signal Vsam, and a control terminal of the second input transistor Q8 receives the selection signal SEL.

The initialization transistor Q6 includes a control terminal that receives an initialization signal Vrst, an input terminal that is grounded, and an output terminal that is connected to the second node n2.

The high voltage transmission transistor Q9 includes a control terminal that is connected to the output terminal n3, an input terminal that is connected to a reference voltage AVDD, and an output terminal that is connected to the second node n2.

The second input transistor Q8 and the high voltage transmission transistor Q9 are of different conductivity types. The waveforms of the sampling signal Vsam and the initialization signal Vrst are determined according to the conductivity types of the first input transistor Q7 and the initialization transistor Q6.

Figure 8:
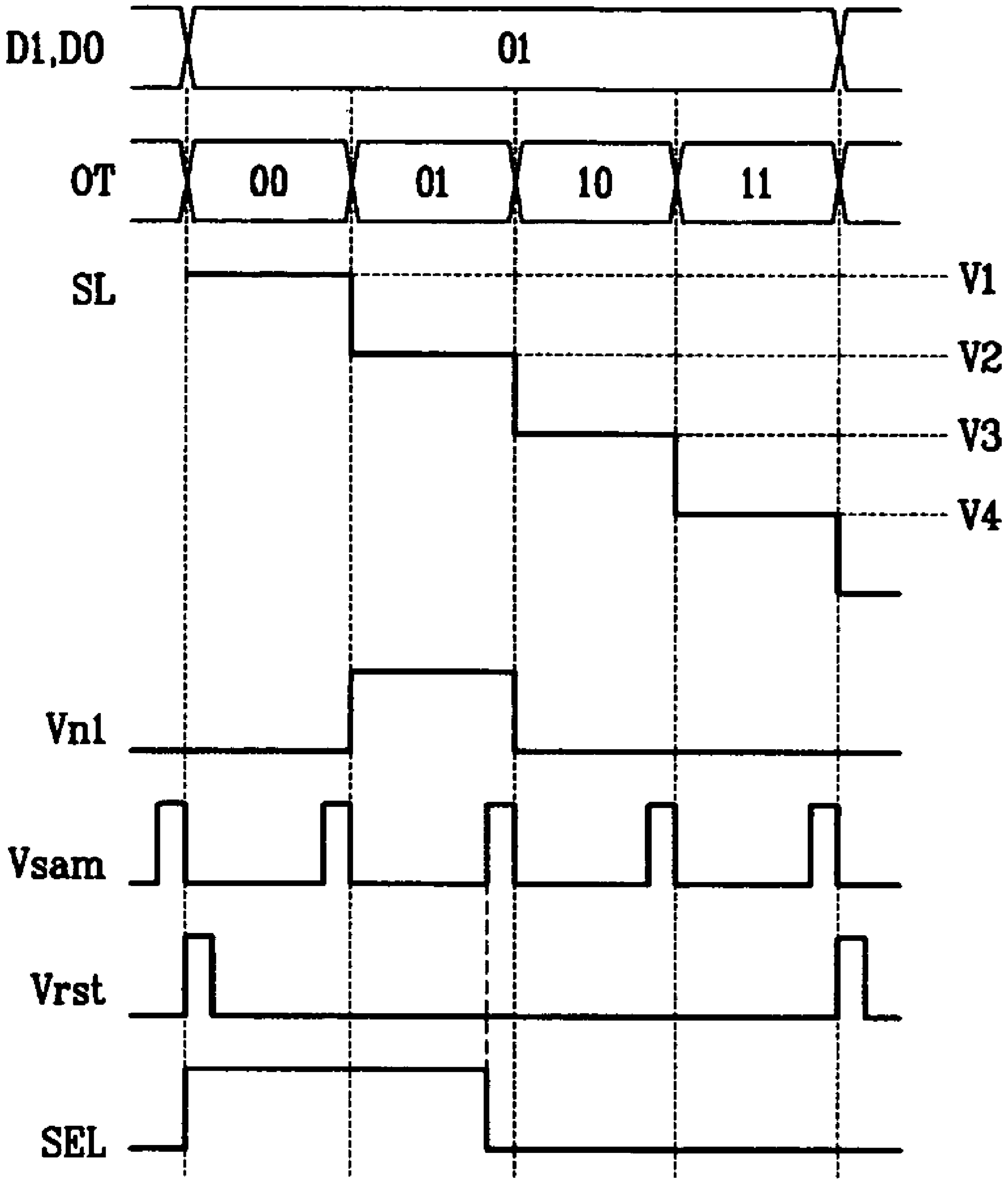
FIG. 8 is a signal waveform chart showing the operations of the data driver and the gray voltage generator according to the exemplary embodiment of the present invention.

The operations of the digital-analog converter 700 and gray voltage generator 800 shown in FIGS. 4 and 7 will now be described in detail with reference to FIG. 8.

As illustrated in the above description and the drawing, it is assumed that the image signal DAT is a six-bit digital signal, and is divided into four-bit upper-bit data and two-bit lower-bit data.

When receiving the image signal DAT from the latch 530, the input selector 710 selects one of the 16 inputs Ga1, Ga2, . . . , and Ga16 on the basis of the upper-bit data D5, D4, D3, and D2 of the image signal DAT, and outputs the selected one as the output SL. The output SL of the input selector 710 temporally includes four different gray voltages.

As described above, four gray voltages included in the output SL are sequentially output according to the output control signal OC of the time controller 750, and the output time information OT about that is provided to output controller 730. The comparator 732 of the output controller 730 compares the lower-bit data D1 and D0 of the image signal DAT and the output time information OT.

For example, it is assumed that, if the output time information OT is 00, the highest gray voltage (hereinafter, referred to as "first gray voltage") V1 in the output units 821 to 836 of gray voltage generator 800 is output, and if the output time information OT is 01, the second highest gray voltage (hereinafter, referred to as "second gray voltage") V2. Further, it is assumed that, if the output time information OT is 10, the third highest gray voltage (hereinafter, referred to as "third gray voltage") V3, and if the output time information OT is 11, the lowest gray voltage (hereinafter, referred to as "fourth gray voltage") V4 is output. In addition, as shown in FIG. 8, it is assumed that the gray voltages are sequentially output from the highest gray voltage to the lowest gray voltage, and the lower-bit data of the image signal DAT is 01. First, if the input selector 710 starts to output the first gray voltage V1, the initialization transistor Q6 of the output controller 730 is turned on according to the initialization signal Vrst and sets the second node n2 to the low voltage, and then is turned off. Then, the output voltage of the inversion gate G5 becomes the high voltage. Accordingly, the high voltage transmission transistor Q9 is turned off, and the second input transistor Q8 is turned on. If the sampling signal Vsam is the low voltage, the first input transistor Q7 is turned off, and thus the second node n2 keeps the low voltage. Therefore, the selection signal SEL of the output controller 730 becomes the high voltage, the output switching element Q1 is turned on, and thus the digital-analog converter 700 outputs the first gray voltage V1.

At this time, the output time information OT is 00. Then, since this is different from the lower-bit data D1 and D0 of the image signal DAT, the comparator 732 outputs the low voltage.

In this state, if the sampling signal Vsam is changed to the high level, the first input transistor Q7 is turned on, and the low voltage of the first node n1 is transmitted to the second node n2. Therefore, the second node n2 keeps the low voltage, and the selection signal generator 734 keeps the selection signal SEL at the high voltage.

Next, if the input selector 710 starts to output the second gray voltage V2, and the output time information OT becomes 01, since the output time information OT and the lower-bit data D1 and D0 are the same, the output of the comparator 732 becomes the high voltage. However, since the first input transistor Q7 is still turned off, the selection signal SEL keeps the high voltage.

If the sampling signal Vsam is changed to the high level, the first input transistor Q7 is turned on, and the high voltage output of the comparator 732 is applied to the second node n2. The inversion gate G5 inverts the high voltage of the second node n2 and outputs the low voltage. Accordingly, the high voltage transmission transistor Q9 is turned on, and the second input transistor Q8 is turned off. The high voltage transmission transistor Q9 transmits the reference voltage AVDD as the high voltage to the second node n2, and keeps the high voltage of the second node n2.

Then, when the selection signal SEL is changed to the low voltage, the output switching element Q1 is turned off, and the output of the digital-analog converter 700 is cut off.

The turned-off second input transistor Q8 keeps the turned-off state until the initialization signal Vrst becomes the high voltage and the second node n2 becomes the low voltage. Therefore, the output of the digital-analog converter 700 is also cut off until then.

The output buffer 570 applies the gray voltage to be finally supplied, that is, the second gray voltage V2, to the data line as the data voltage, and keeps the voltage for one horizontal period.

The present invention can be applied to other display devices, such as an organic light emitting diode (OLED) display and so on, in addition to the above-described liquid crystal display.

According to the present invention, the gray voltages that are output at different time are generated, and one of them is selected. Therefore, the size of the digital-analog converter can be markedly reduced.

While the present disclosure of invention has been provided in connection with exemplary embodiments, it is to be understood that various modifications and equivalent arrangements will be apparent to those skilled in the art in light of the foregoing and may be made without, however, departing from the spirit and scope of the present teachings.

What is claimed is:

1. A driving apparatus that is structured to drive a corresponding display device in response to a supplied image signal, where the image signal includes first and second portions both specifying a desired voltage signal that is to be selected and output during a prespecified timing duration, the driving apparatus comprising:

a gray voltage generator that is operative to be powered by a single power supply and is operative to generate a plurality of gray voltage sets, each set of gray voltages including gray voltages having different levels, which levels are determined by a voltage setting of the single power supply, where the different levels are then serially and synchronously transmitted from the gray voltage generator, one sequentially after a next in accordance with a synchronizing timing control signal supplied to the gray voltage generator to thereby define a corresponding synchronous serial voltage signal; and a signal converter that includes:

a first selector structured to select one of the synchronous serial voltage signals produced from a corresponding one of the gray voltage sets generated by the gray voltage generator, where the first selector is responsive to the first portion of the image signal for accordingly selecting a corresponding one of the synchronous serial voltage signals, and a second selector structured to select and synchronously sequentially output two or more of the gray voltages among the plurality of gray voltages belonging to the selected one synchronous serial voltage signal, where the second selector is responsive to the second portion of the image signal and to a timing information signal that is synchronized to the timing control signal supplied to the gray voltage generator;

wherein the first portion of the image signal comprises a third portion and a fourth portion, and wherein the first selector comprises a first switching element group that selects a subset of gray voltage sets from among the plurality of gray voltage sets on the basis of the third portion of the image signal, and a second switching element group that selects a gray voltage set from the selected subset on the basis of the fourth portion of the image signal.

2. The driving apparatus of claim 1, wherein the gray voltage generator is structured so as to be able to sequentially output the plurality of gray voltages belonging to a selected one of the gray voltage sets according to a predefined one of different voltage outputting sequences as defined by the timing control signal that is supplied to the gray voltage generator.

3. The driving apparatus of claim 2, wherein the gray voltage generator comprises a plurality of switching elements structured to sequentially transmit the gray voltages of a selected gray voltage set one after the next in accordance with a sequence defined by the timing control signal.

4. The driving apparatus of claim 3 and further comprising a sequence truncating circuit that outputs a selectively truncated version of the selected one synchronous serial voltage signal, wherein the last output gray voltage that is output in the truncated version is determined by the second portion of the image signal.

5. The driving apparatus of claim 3, further comprising:

a time controller that is coupled to the gray voltage generator and to the second selector and is structured to correspondingly provide the second selector with the timing information signal and to provide the gray voltage generator with the timing control signal that defines the sequence and timing of the sequentially output gray voltages of the generated synchronous serial voltage signals.

6. The driving apparatus of claim 5, wherein the second selector comprises:

a switch element that selectively transmits, during defined time periods, the plurality of gray voltages belonging to the selected gray voltage set, and an output controller that generates a selection signal for controlling when and which of the gray voltages in the selected gray voltage set the switching element will transmit, the output controller being responsive to the timing information signal and to the second portion of the image signal.

7. The driving apparatus of claim 6, wherein the output controller comprises a sequence duration determining circuit that is structured to determine a duration of an output sequence output by the switch element and that is responsive to the second portion of the image signal.

8. The driving apparatus of claim 7, wherein the output controller comprises:

a logic circuit that is responsive to the second portion of the image signal and to the timing information signal and is operative to shorten the duration of the output sequence output by the switch element, and a selection signal generator that generates the selection signal with a duration determined by the logic circuit.

9. The driving apparatus of claim 2, wherein the first selector comprises a plurality of switching element sections, with each section having a plurality of switching elements connected in series to one another, and with each of the switching element sections being responsive to a respective encoding of the first portion of the image signal so as to transmit its respective gray voltage set according to an encoding provided by the first portion of the image signal.

10. The driving apparatus of claim 1, wherein the first selector further comprises:

a first converter that converts the third portion of the image signal so as to generate a first control signal for controlling the first switching element group, and a second converter that converts the fourth portion of the image signal so as to generate a second control signal for controlling the second switching element group.

11. The driving apparatus of claim 2, wherein the first portion of the image signal defines a more significant value portion of the image signal and the second portion thereof defines a less significant value portion of the image signal.

12. A display device comprising:

a voltage generator that generates a plurality of gray voltage sets, with each set including a plurality of gray voltages having different levels, the different levels being defined by a reference voltage supplied to the voltage generator;

a plurality of gray voltage output units that respectively cyclically and sequentially output a plurality of gray voltages belonging to one of the plurality of gray voltage sets through one output terminal;

a first selector that is responsive to a first portion of the image signal and that selects one of the gray voltage sets on the basis of the first portion of the image signal;

a second selector that is responsive to a second portion of the image signal and that is structured to sequentially output two or more of the different voltage levels of the one selected gray voltage set during a predetermined time duration; and a display panel that is structured to display an image according to the output of the second selector;

wherein the first portion of the image signal comprises a third portion and a fourth portion, and wherein the first selector comprises a first switching element group that selects a subset of gray voltage sets from among the plurality of gray voltage sets on the basis of the third portion of the image signal, and a second switching element group that selects a gray voltage set from the selected subset on the basis of the fourth portion of the image signal.

13. The display device of claim 12, wherein each of the gray voltage output units comprises a plurality of switching elements, and each of the switching elements is connected between one of a plurality of gray voltages belonging to the supplied gray voltage set and the output terminal of the gray voltage output unit, and is controlled by an output control signal.

14. The display device of claim 12, further comprising a time controller that provides the second selector with gray voltage output time information of each of the gray voltage output units.

15. The display device of claim 14, wherein the second selector comprises:

a pulse width modulator that performs pulse width modulation on the second portion data of the image signal on the basis of the output time information so as to generate a selection signal; and an output switching element that is controlled according to the selection signal and is connected to the output of the first selector.

16. The display device of claim 15, wherein the pulse width modulator comprises:

a comparator that compares the second portion data of the image signal with the output time information and outputs an output signal, and a selection signal generator that converts a level of the selection signal according to the output signal of the comparator.

17. The display device of claim 16, wherein the selection signal generator comprises:

a first transistor that is connected to the output of the comparator and is controlled according to a first control signal;

a second transistor that is connected between the first transistor and a reference node and is controlled according to the selection signal;

an inversion gate that has an input terminal connected to the reference node and outputs the selection signal; and a third transistor that is connected between a first voltage and the reference node and is controlled according to the selection signal.

18. The display device of claim 17, wherein the selection signal generator further comprises a fourth transistor that is connected between a second voltage and the reference node and is controlled according to a second control signal.

19. The display device of claim 18, wherein the second transistor and the third transistor are transistors of different conductivity types.

* * * * *